United States Patent [19]

Nakamura

[11] Patent Number: 4,868,405

[45] Date of Patent: Sep. 19, 1989

[54] PHOTOELECTRIC CONVERTING APPARATUS HAVING A COMMON REGION CONNECTING EITHER SOURCES OR DRAINS TO A COMMON SIGNAL LINE

[75] Inventor: Kenichi Nakamura, Isehara, Japan

[73] Assignee: Canon Kabushiki Kaisha, Tokyo, Japan

[21] Appl. No.: 116,141

[22] Filed: Nov. 3, 1987

[30] Foreign Application Priority Data

Nov. 19, 1986 [JP]  Japan ................................ 61-273917

[51] Int. Cl.$^4$ ............................................ H01J 40/14
[52] U.S. Cl. .................................... 250/578; 357/30
[58] Field of Search ...................... 357/46, 30 I, 30 D, 357/30 H; 250/578, 211 J, 211 R, 213.11

[56] References Cited

U.S. PATENT DOCUMENTS

| | | | |
|---|---|---|---|
| 4,264,930 | 4/1981 | White | 358/213.26 |
| 4,635,088 | 1/1987 | Eguchi | 357/46 |
| 4,678,938 | 7/1987 | Nakamura | 250/578 |

Primary Examiner—David C. Nelms
Assistant Examiner—Eric F. Chatmon
Attorney, Agent, or Firm—Fitzpatrick, Cella, Harper & Scinto

[57] ABSTRACT

A photoelectric converting apparatus having a plurality of photosensors and a plurality of transistors of the insulative gate type which select the signals from the photosensors and output to a signal line. Source or drain regions which are connected to the signal line are formed as a common region in a desired number of transistors, thereby reducing the wiring capacitance of the signal line.

15 Claims, 5 Drawing Sheets

PHOTOELECTRIC CONVERTING APPARATUS HAVING A COMMON REGION CONNECTING EITHER SOURCES OR DRAINS TO A COMMON SIGNAL LINE

BACKGROUND OF THE INVENTION

1. Field of the Invention

The present invention relates to a photoelectric converting apparatus having a plurality of photosensors, and a plurality of transistors of the insulative gate type which select the signals from the photosensors and output them to a signal line and, more particularly, to a photoelectric converting apparatus for allowing the signal outputs from the photosensors to be read out without reducing the level of those signal outputs.

2. Relates Background Art

FIG. 1A is a schematic circuit diagram of a scan switching section in a conventional photoelectric converting apparatus. FIG. 1B is a schematic plan view showing a constitution of the scan switching section.

In FIG. 1A, signals from photosensor cells $S_l$ to $S_n$ are accumulated in capacitors $C_l$ to $C_n$, each having a capacitance $C_t$. Thereafter, these signals are sequentially transmitted through transistors $Q_l$ to $Q_n$ and are read out to a signal line 1 and are serially output through an output amplifier 3. The ON/OFF operations of the transistors $Q_l$ to $Q_n$ are controlled by pulses $\phi h_l$ to $\phi h_n$ which are generated from a scan circuit 2.

The transistors $Q_l$ to $Q_n$ are MOS type transistors having a pattern as shown in FIG. 1B. Each of these transistors is an n channel MOS transistor comprising: a drain region 4 and a source region 5 each of which consists of an n+ semiconductor; and a gate electrode 6 provided through an oxide film. The drain regions 4 of the respective cells are connected to the capacitors $C_l$ to $C_n$. On the other hand, the source regions 5 are commonly connected to the signal line 1. Therefore, for example, when the positive voltage pulse $\phi h_l$ is applied from the scan circuit 2 to the gate electrode 6 of the transistor $Q_l$, the transistor $Q_l$ is made conductive and transfers the signal (signal charges Q) accumulated in the capacitor $C_l$ to the signal line 1. The other transistors are also similar to the transistor $Q_l$.

In this case, since the signal line 1 itself has a capacitance $C_h$, when the signal charges Q accumulated in the capacitor having the capacitance $C_t$ are transferred to the signal line 1, a voltage $V_h$ appearing on the signal line 1 is set to $Q/(C_t+C_h)$.

However, in the foregoing conventional photoelectric converting apparatus, the drain region 5 of each transistor is connected to the signal line 1. Therefore, the ratio of the capacitances of the drain regions 5 to the stray capacitance $C_h$ of the signal line 1 is large, so that there is a problem such that the voltage $V_h$ appearing on the signal line 1 decreases and the S/N ratio of the signal is deteriorated. This problem is typical in the case of a high resolution sensor in which a number of photosensors are arranged.

For example, in FIG. 1B, the capacitance of the drain region 5 of the transistor $Q_l$ connected to the signal line 1 is calculated. First, when the capacitance per unit area is set to $5\times10^{-5}$ pF/$\mu$m$^2$, the capacitance of the bottom surface of the drain region 5 is about 0.005 pF. On the other hand, when the capacitance per unit area is 1.5 pF/$\mu$m$^2$, the capacitance of the side surface is about 0.005 pF. By adding these values, the capacitance of the drain region 5 is about 0.01 pF.

Therefore, assuming that 100 (n=100) sensors are arranged, for example in a row, the capacitance which is applied to the signal line 1 by the transistors $Q_l$ to $Q_n$ is set to about 1 pF. Since each capacitance of the capacitors $C_l$ to $C_n$ to accumulate the output signals is a few pF, the value of about 1 pF is large enough to cause the deterioration of the output signals. As explained above, the conventional apparatus has a problem in deterioration of the outputs in the case where, in particular, a number of sensors are arranged disposed in the photoelectric converting apparatus.

SUMMARY OF THE INVENTION

It is an object of the present invention to provide a photoelectric converting apparatus which can solve the conventional drawbacks as mentioned above.

Another object of the invention is to provide a photoelectric converting apparatus which can reduce the deterioration in outputs due to the capacitances of the wiring as mentioned above.

To accomplish the above objects, according to an embodiment of the invention, there is provided a photoelectric converting apparatus having a plurality of photosensors and a plurality of transistors of the insulative gate type to select signals from the photosensors and to output them to a signal line, wherein the regions connected to the signal line among the source and drain regions of the transistors are formed as a common region in a desired number of transistors.

Since the regions connected to the signal line are commonly used by a desired number of transistors, the whole capacitance in these regions can be reduced and the capacitance of the signal line can be decreased. Thus, the signal levels of the photosensors which were output to the signal line can be remarkably improved as compared with those in the conventional apparatus.

The above and other objects and features of the present invention will become apparent from the following detailed description and the appended claims with reference to the accompanying drawings.

DETAILED DESCRIPTION OF THE PREFERRED EMBODIMENT

An embodiment of the present invention will be described in detail hereinbelow with reference to the drawings.

Figure 2A:
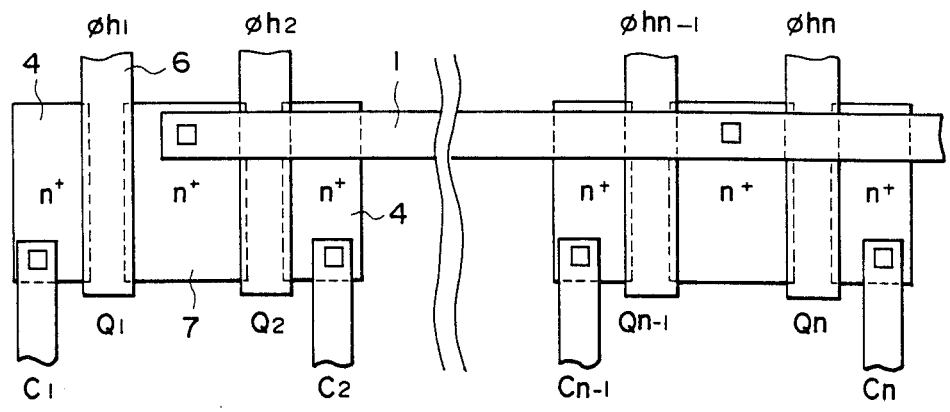
FIG. 2A is a schematic plan view of a scan switching section in an embodiment of a photoelectric converting apparatus according to the present invention.
Figure 2B:
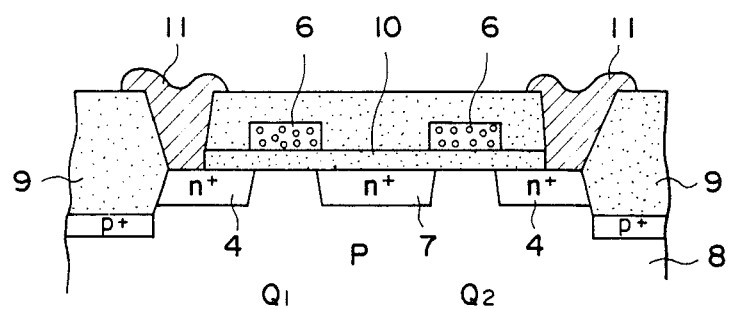
FIG. 2B is a schematic cross sectional view of transistors constituting the scan switching section in FIG. 2A.

FIG. 2A is a schematic plan view of a scan switching section in an embodiment of a photoelectric converting apparatus according to the invention. FIG. 2B is a schematic cross sectional view of a transistor constituting the scan switching section.

Figure 1A:
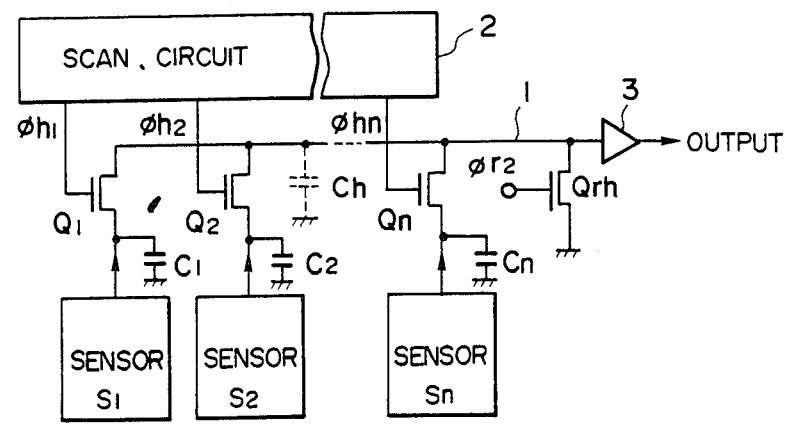
FIG. 1A is a schematic circuit diagram of a scan switching section in a conventional photoelectric converting apparatus.

An equivalent circuit of the scan switching section shown in FIG. 2A is the same as that shown in FIG. 1A. Therefore, the transistors $Q_1$ to $Q_n$ and the signal line 1 shown in FIG. 2A have the same functions as those shown in FIG. 1A.

Figure 1B:
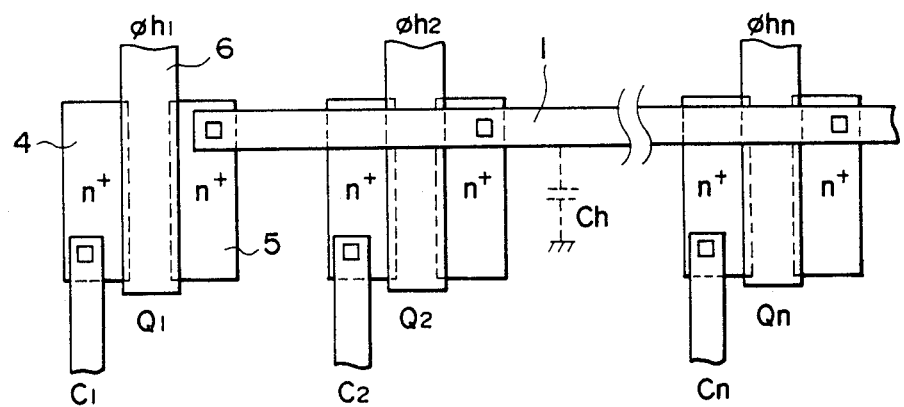
FIG. 1B is a schematic plan view showing a constitution of the scan switching section in FIG. 1A.

However, a practical constitution of the scan switching section in the embodiment shown in FIG. 2A differs from that of the conventional scan switching section shown in FIG. 1B.

This embodiment is constituted in a manner such as shown in FIG. 2A wherein every two transistors $Q_1$ to $Q_n$ form a pair and each pair commonly uses one drain region 7.

Referring to FIG. 2B, first, a device separation region 9 is formed in a p region 8. Then, two gate electrodes 6 made of polysilicon are formed over the p region 8 through an oxide layer 10. Subsequently, the n+ regions 4 and 7 serving as source and drain regions are respectively formed using the gate electrodes 6 as masks. Source electrodes 11 and the signal line 1 are formed by a metal such as aluminum or the like, respectively.

Since the drain region 7 is commonly used by two transistors as mentioned above, even if a number of transistors $Q_1$ to $Q_n$ are arranged, the capacitance of the drain region is reduced by half as compared with that in the conventional apparatus. The capacitance is now calculated. First, when the capacitance per unit area is set to the same value of $5 \times 10^{-5}$ pF/$\mu$m$^2$ as that in the conventional apparatus, the capacitance of the bottom surface of the drain region 7 becomes about 0.006 pF. On the other hand, when the capacitance per unit area is set to 1.5 pF/$\mu$m$^2$, the capacitance of the side surface becomes about 0.004 pF. Since the sum of these values corresponds to the drain capacitances of two transistors, the drain capacitance of one transistor is 0.005 pF. This value is just half of the drain capacitance in the conventional apparatus.

Therefore, the capacitance $C_h$ of the signal line 1 in the embodiment is remarkably reduced as compared with the conventional one, so that the sensor signals transferred to the signal line 1 increase compared to those in the conventional apparatus. On the other hand, since the number of contact portions of the signal line 1 and the respective drain regions 7 is just half of the conventional one, the yield in manufacturing of photoelectric converting apparatuses is also improved.

A photosensor suitable to be combined with the embodiment will now be described.

Figure 3A:
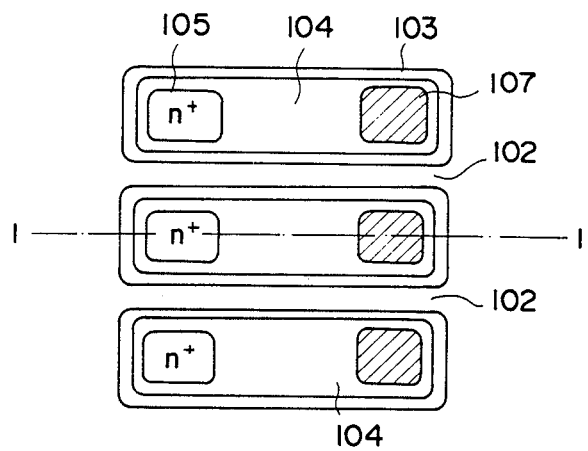
FIG. 3A is a schematic plan view of photosensor cells.
Figure 3B:
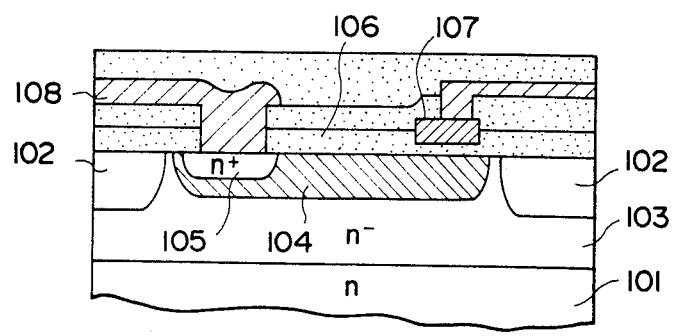
FIG. 3B is a cross sectional view taken along the line I—I in FIG. 3A.
Figure 3C:
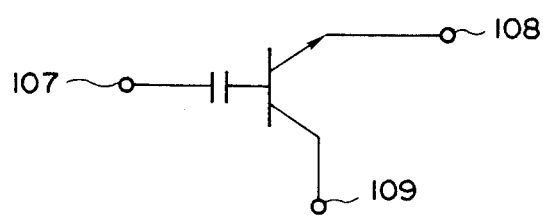
FIG. 3C is an equivalent circuit diagram of FIG. 3B.

FIG. 3A is a schematic plan view of photosensor cells. FIG. 3B is a cross sectional view taken along the line I—I in FIG. 3A. FIG. 3C is an equivalent circuit diagram of FIG. 3A.

In each diagram, photosensor cells are formed and arranged in a line on an n type substrate 101. Each photosensor cell is electrically isolated from the adjacent photosensor cells by a device separation region 102.

Each photosensor cell has the following constitution.

An n$^-$ epitaxial region (hereinafter, referred to as an n$^-$ region) 103 is formed on the substrate 101. A p region 104 and an n+ region 105 are formed in the n$^-$ region 103 as will be explained hereinlater. The n$^-$ region 103, p region 104, and n+ region 105 correspond to the collector, base, and emitter of a bipolar transistor, respectively.

An oxide layer 106 is formed over the n$^-$ region 103 in which the respective regions were formed as explained above. A capacitor electrode 107 having a predetermined area is formed on the oxide layer 106 so as to face the p region 104.

The capacitor electrode 107 faces the p region 104 through the oxide layer 106. By applying a desired voltage to the capacitor electrode 107, the potential of the p region 104, which is in the floating state, can be controlled.

Further, an emitter electrode 108 connected to the n+ region is formed. Also, an electrode 109 (not shown) to apply the potential to the collector of the bipolar transistor is formed below the back surface of the substrate 101 through an n+ region having a high impurity concentration.

The fundamental operation will now be explained.

First, it is assumed that the p region 104 serving as the base of the bipolar transistor is set to an initial potential. The light enters the p region 104. The holes among the electron/hole pairs generated by the incident light are accumulated in the p region 104. The potential of the p region 104 increases in the positive direction by the accumulated holes (accumulating operation).

Subsequently, the emitter electrode 108 is set into the floating state and a positive voltage pulse for reading is applied to the capacitor electrode 107. When the positive voltage is applied to the capacitor electrode 107, the base potential rises and the portion between the base and emitter is set into the forward bias state. Thus, the bipolar transistor is made operative, so that the signal corresponding to the incident light quantity can be derived from the emitter electrode 108 in the floating state (reading operation). In this case, since the accumulated charge amount in the p region 104 serving as the base hardly decreases, the same light information can be repeatedly read out.

On the other hand, to eliminate the holes accumulated in the p region 104, the emitter electrode 108 is grounded and a refresh pulse of the positive voltage is applied to the capacitor electrode 107. By applying this pulse, the p region 104 is forwardly biased to the n+ region 105. The accumulated holes are eliminated through the grounded emitter electrode 108. when the refresh pulse trails, the p region 104 is returned to the initial state (refreshing operation). Subsequently, the respective operations for accumulating, reading, and refreshing are similarly repeated.

Figure 4:
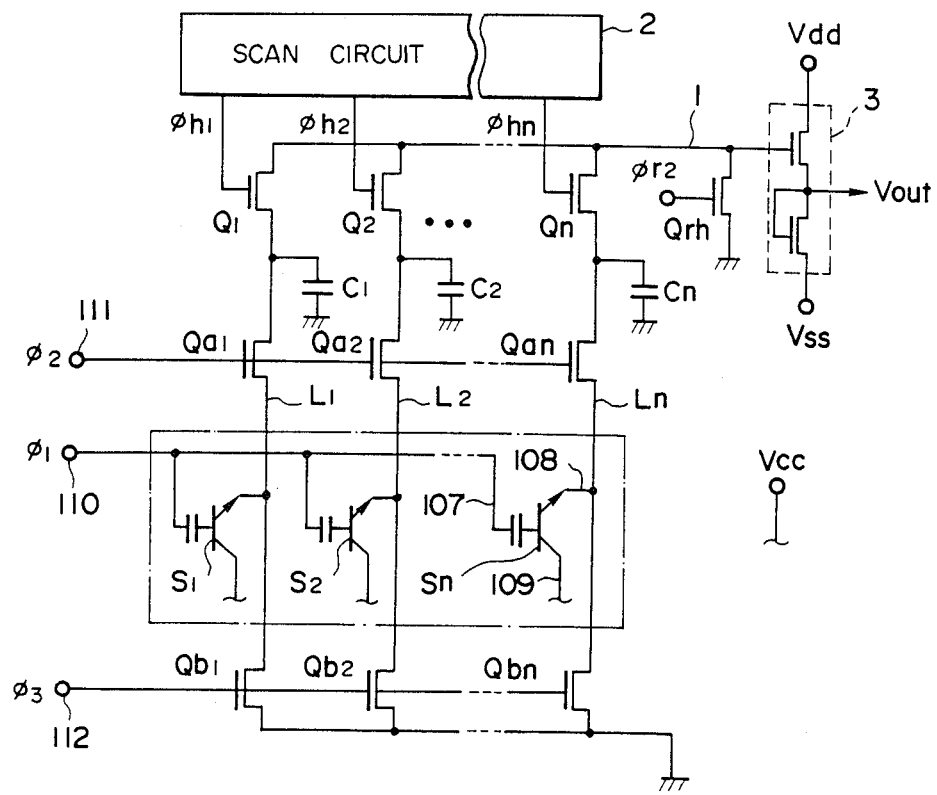
FIG. 4 is a circuit diagram of a line sensor as an embodiment using the photosensor cells.

FIG. 4 is a circuit diagram of a line sensor as an embodiment using the foregoing photosensor cells.

In the diagram, a constant positive voltage $V_{cc}$ is applied to each collector electrode 109 of the photosensor cells $S_l$ to $S_n$. Each capacitor electrode 107 is commonly connected to a terminal 110. A pulse $\phi_1$ to perform the reading and refreshing operations is applied to the terminal 110. The emitter electrodes 108 are connected to vertical lines $L_l$ to $L_n$. The vertical lines $L_l$ to $L_n$ are connected to capacitors $C_l$ to $C_n$ for accumulation through buffer transistors $Q_{al}$ to $Q_{an}$, respectively. The gate electrodes of the transistors $Q_{al}$ to $Q_{an}$ are commonly connected to a terminal 111. A pulse $\phi_2$ is applied to the terminal 111.

The capacitors $C_l$ to $C_n$ are connected to the output line 1 through the transistors $Q_l$ to $Q_n$, respectively. The gate electrodes of the transistors $Q_l$ to $Q_n$ are connected to parallel output terminals of the scan circuit 2, respectively. Pulses $\phi_{hl}$ to $\phi_{hn}$ are sequentially output from the parallel output terminals.

The output line 1 is grounded through a transistor $Q_{rh}$ to refresh the output line 1. A pulse $\phi_{r2}$ is applied to the gate electrode of the transistor $Q_{rh}$.

On the other hand, the vertical lines $L_l$ to $L_n$ are grounded through buffer transistors $Q_{bl}$ to $Q_{bn}$, respectively. The gate electrodes of the respective transistors are commonly connected to a terminal 112. A pulse $\phi_3$ is applied to the terminal 112.

Figure 5:
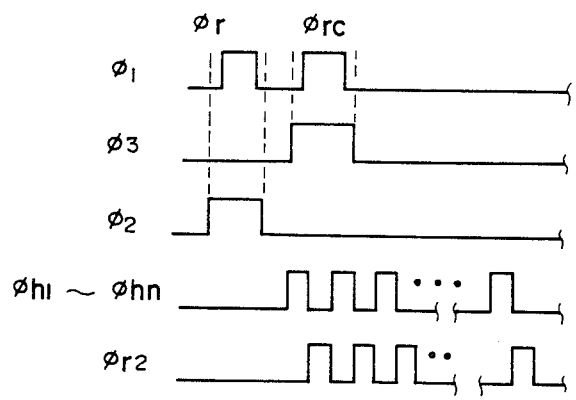
FIG. 5 is a timing chart for explaining the operation of the line sensor.

FIG. 5 is a timing chart for explaining the operation of the line sensor.

First, it is assumed that the carriers corresponding to the illuminance of the incident light are accumulated in each of the photosensor cells $S_l$ to $S_n$. In this state, by turning on transistors $Q_{al}$ to $Q_{an}$ and turning off transistors $Q_{bl}$ to $Q_{bn}$ by a pulse $\phi_2$, the emitter electrode 108 is set into the floating state. A positive voltage pulse $\phi_r$ for reading is applied to the terminal 111. Thus, as already mentioned above, the output signals of the cells are generated to the emitter side in the floating state. The respective output signals are accumulated in the capacitors $C_l$ to $C_n$. After the output signals have completely been read out, the transistors $Q_{al}$ to $Q_{an}$ are turned off by the pulse $\phi_2$.

Subsequently, the transistors $Q_{bl}$ to $Q_{bn}$ are turned on by the pulse $\phi_3$. The emitter electrodes 108 of the cells are grounded. A refresh pulse $\phi_{rc}$ is applied to the terminal 111. Thus, the foregoing refreshing operation is performed and the holes accumulated in the base region 104 are extinguished. After completion of the refreshing operation, each cell starts the accumulating operation.

On the other hand, the scan circuit 2 outputs the pulses $\phi_{hl}$ to $\phi_{hn}$ in parallel with the refreshing operations, thereby sequentially turning on the transistors $Q_l$ to $Q_n$. Thus, the signals accumulated in the capacitors $C_l$ to $C_n$ are sequentially read out to the output line 1 and are output as an output signal $V_{out}$ to the outside through the amplifier 3. At this time, whenever each signal is output, the transistor $Q_{rh}$ is turned on by the pulse $\phi_{r2}$ to thereby eliminate the preceding residual carriers on the output line 1.

After the readout signals of all of the cells $S_l$ to $S_n$ were output, the next reading operation is started. In a manner similar to the above, by repeating the above-mentioned operations, the image signal can be output.

Figure 6:
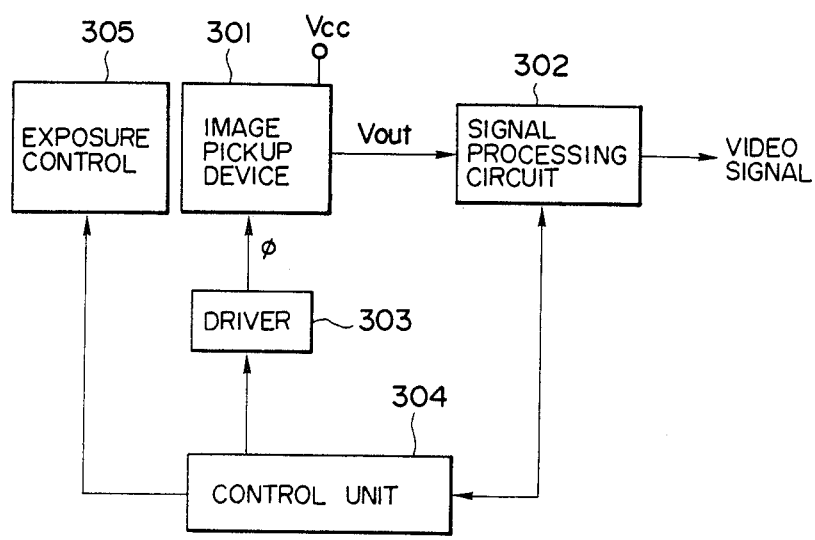
FIG. 6 is a schematic constitutional diagram of an example of an image pickup apparatus using the photoelectric converting apparatus.

FIG. 6 is a schematic constitutional diagram of an example of an image pickup apparatus using the foregoing photoelectric converting apparatus.

In the diagram, an image pickup device 301 corresponds to the photoelectric converting apparatus shown in FIG. 4. An output signal $V_{out}$ of the image pickup device 301 is subjected to the processes such as gain adjustment and the like by a signal processing circuit 302 and thereafter, it is output as a video signal.

On the other hand, each of the foregoing pulses to drive the image pickup device 301 is supplied from a driver 303. The driver 303 operates under control of a control unit 304. On the basis of an output of the image pickup device 301, the control unit 304 adjusts the gain and the like of the signal processing circuit 302 and also controls an exposure control means 305, thereby adjusting an incident light quantity to the image pickup device 301.

In this embodiment, the signal $V_{out}$ of a high output can be obtained. therefore, the load of the signal processing circuit 302 in the image pickup apparatus can be reduced and the S/N ratio is also improved.

As described in detail above, in the photoelectric converting apparatus according to the invention, one of the source and drain regions connected to the signal line is commonly used by a desired number of transistors, so that the whole capacitance of this region can be reduced and the capacitance of the signal line can be decreased. Thus, the signal levels of the photosensors which were read out to the signal line can be remarkably improved over the conventional ones. The S/N ratio of the output signal can be also improved.

What is claimed is:

1. A photoelectric converting apparatus comprising: a plurality of photosensors; and
a plurality of transistors of an insulative gate type, each having a source and a drain electrode, for selecting signals from said photosensors to output to a signal line,
wherein the source regions or the drain regions of a predetermined number of said transistors are formed as a common region, said common region being connected to said signal line.

2. An apparatus according to claim 1, wherein each said photosensor comprises a sensor of a type for (1) performing an accumulating operation to accumulate carriers generated by a light excitation of a control electrode region of a semiconductor transistor by controlling a potential of said control electrode region, (2) a reading operation to read out an accumulated voltage which was generated by said accumulating operation, and (3) a refreshing operation to extinguish the accumulated carriers.

3. An apparatus according to claim 1, wherein each said photosensor reads out an output signal as a voltage signal.

4. An apparatus according to claim 1, wherein each said photosensor has a capacitive load.

5. An apparatus according to claim 1, wherein said common region comprises a drain region.

6. An apparatus according to claim 1, wherein each said photosensor includes a bipolar transistor.

7. An image pickup apparatus comprising:
(a) a plurality of signal sources; and
(b) a plurality of switching means for selectively connecting an output of each of said signal sources to a common signal line,
wherein each of said switching means includes
(b-1) a control electrode region,
(b-2) a first main electrode region connected to each of said signal sources, and
(b-3) a second main electrode region connected to said common signal line, said second main electrode region also serving as a second main electrode region for at least one other switching means.

8. An apparatus according to claim 7, wherein each said signal source comprises a photosensor.

9. An apparatus according to claim 8, wherein said photosensor has a capacitive load.

10. An apparatus according to claim 7, wherein each said signal source includes a bipolar transistor.

11. An apparatus according to claim 7, wherein each said switching means includes a transistor of an insulative gate type.

12. An apparatus according to claim 11, wherein said second main electrode region comprises a drain region.

13. An apparatus according to claim 7, further comprising a shift register for sequentially supplying a control signal to a control electrode of each of said switching means.

14. An apparatus according to claim 7, further comprising an output amplifier to output a signal from said common signal line as a voltage signal.

15. An apparatus according to claim 14, further comprising signal processing means for controlling a gain of the signal transmitted through said output amplifier.

* * * * *

UNITED STATES PATENT AND TRADEMARK OFFICE
CERTIFICATE OF CORRECTION

PATENT NO. : 4,868,405
DATED : September 19, 1989
INVENTOR(S) : Kenichi Nakamura It is certified that error appears in the above-identified patent and that said Letters Patent is hereby corrected as shown below:

COLUMN 1:

Line 18, change "Relates" to --Related--.

COLUMN 6:

Line 4, change "therefore," to --Therefore,--.

Signed and Sealed this

Twelfth Day of March, 1991

*Attest:*

HARRY F. MANBECK, JR.

*Attesting Officer*  *Commissioner of Patents and Trademarks*